United States Patent [19]

Maegawa et al.

[11] Patent Number: 5,238,864
[45] Date of Patent: Aug. 24, 1993

[54] METHOD OF MAKING SOLID-STATE IMAGING DEVICE

[75] Inventors: Shigeto Maegawa; Kiyohiko Sakakibara; Hidekazu Yamamoto, all of Itami, Japan

[73] Assignee: Mitsubishi Denki Kabushiki Kaisha, Tokyo, Japan

[21] Appl. No.: 974,076

[22] Filed: Nov. 10, 1992

Related U.S. Application Data

[62] Division of Ser. No. 811,118, Dec. 20, 1991, Pat. No. 5,191,399.

Foreign Application Priority Data

Dec. 21, 1990 [JP] Japan ............................ 2-413391
Sep. 6, 1991 [JP] Japan ............................ 3-255773

[51] Int. Cl.$^5$ .............................................. H01L 21/339
[52] U.S. Cl. ................................ 437/53; 437/30; 437/154; 437/158
[58] Field of Search .................... 437/28, 30, 50, 53, 437/149, 150, 153, 154, 158

[56] References Cited

U.S. PATENT DOCUMENTS

| | | | |
|---|---|---|---|
| 4,484,210 | 11/1984 | Shiraki et al. | 257/233 |
| 4,613,402 | 9/1986 | Losee et al. | 437/53 |
| 4,672,455 | 6/1987 | Miyatake | 257/223 |
| 4,851,890 | 7/1989 | Miyatake | 437/53 |
| 5,043,783 | 8/1991 | Matsumoto et al. | 257/257 |
| 5,091,336 | 2/1992 | Beasom | 437/150 |
| 5,118,631 | 6/1992 | Dyck et al. | 437/53 |
| 5,134,087 | 7/1992 | Hynecek | 437/53 |

FOREIGN PATENT DOCUMENTS 61-57181 3/1986 Japan .
1147862 6/1989 Japan .

OTHER PUBLICATIONS

Teranishi et al., "No Image Lag Photodiode Structure in the In-Line CCD Image Sensor", IEEE Electron Devices Society, 1982, pp. 324–327.

Primary Examiner—Brian E. Hearn
Assistant Examiner—C. Chaudhari
Attorney, Agent, or Firm—Leydig, Voit & Mayer

[57] ABSTRACT

A method for producing a solid-state imaging device including a photodetector including implanting two different dopant impurity ions, each producing the second conductivity type and having different diffusion coefficients in a first conductivity type semiconductor layer; thermally diffusing the implanted ions to produce a second conductivity type region including a relatively deep second conductivity type subregion and a relatively shallow second conductivity type region having a higher dopant impurity concentration than said relatively deep second conductivity type subregion; forming a charge transfer electrode on said semiconductor layer such that an edge of said electrode lies adjacent part of the junction between said semiconductor layer and said second conductivity type region; and implanting a dopant impurity producing the first conductivity type in said second relatively shallow second conductivity type subregion using said charge transfer electrode as a mask to produce a first conductivity type impurity diffusion region shallower than said relatively shallow second conductivity type subregion.

4 Claims, 9 Drawing Sheets

METHOD OF MAKING SOLID-STATE IMAGING DEVICE

This application is a division of application Ser. No. 07/811,118, now U.S. Pat. No. 5,191,399 filed Dec. 20, 1991.

FIELD OF THE INVENTION

The present invention relates to a solid-state imaging device and a production method therefor and, more particularly, to a construction and a production method of a photo detector as a component of the solid-state imaging device.

BACKGROUND OF THE INVENTION

FIG. 3 is a diagram illustrating a cross section of a prior art solid-state imaging device disclosed in the International Electron Devices Meeting, 1982, p.324. In FIG. 3, reference numeral 1 designates an n type Si substrate. A first p conductivity type region 2 is produced in the Si substrate 1. A first n conductivity type region 4 which is to be a channel of a charge coupled device (hereinafter referred to as CCD), a second n conductivity type region 5 carrying out the photo detection, and a second p conductivity type region 3 serving as a channel stopper are produced in the first p conductivity type region 2. A third p conductivity type region 6 is produced in the second n conductivity type region 5 to suppress the generation of dark current at the interface between the Si substrate 1 and an $SiO_2$ film 7. A charge transfer electrode 8 of the CCD comprises a polysilicon film formed on the surface of the element.

FIG. 4 is a diagram showing the impurity concentration distribution taken along the line B—B' of FIG. 3. As shown in FIG. 4, impurity concentration distributions are formed in the order of p, n, p, and n type from the surface of the element.

A description is given of the operation.

When light is incident to the element from the above, photoelectrons are generated in the depletion layers adjacent to the pn junctions which are produced between the second n conductivity type region 5 and the first and third p conductivity type regions 2 and 6 and the photoelectrons are stored in the second n conductivity type region 5. When a high level voltage is applied to the polysilicon film 8 serving as a charge transfer electrode after a predetermined storage time, the photoelectrons are transferred to the channel 4 of the CCD and further output to the outside.

FIG. 7 is a diagram showing an electric potential distribution taken along the line B—B' of FIG. 3. The function of the third p conductivity type region 6 is described in detail using this figure.

The second n conductivity type region 5 is intended to be completely depleted at the time when photoelectrons are transferred to the channel 4 of the CCD. Otherwise, remaining electrons result an afterimage through the thermal diffusion process. However, when there is no third p conductivity type region 6, complete depletion of the second n conductivity type region 5 means that the depletion extends to the interface with the $SiO_2$ film 7. There is a defect 16 which produces an energy level in the energy band gap of the silicon at the $SiO_2$ interface and it functions as a generating center of dark current charge carriers. Accordingly, the third p conductivity type region 6 is provided to produce accumulated holes, thereby suppressing the generation of the dark current caused by the defect at the interface.

A description is given of the production method.

FIGS. 5(a) to 5(c) are cross-sectional diagrams illustrating a production process of the solid-state imaging device having the above-described construction.

Firstly, boron is implanted into the n type Si substrate 1 to produce the first p conductivity type region 2. Phosphorus and boron are selectively implanted through a resist mask and then they are diffused respectively through annealing process to produce the second p conductivity type region 3, the first n conductivity type region 4, and the second n conductivity type region 5 (FIG. 5(a)).

Next, the $SiO_2$ film 7 is formed on the surface of the Si substrate 1 by a thermal oxidation method. The polysilicon film 8 is deposited using the chemical vapor deposition (CVD) method and thereafter the polysilicon film 8 is patterned into a desired configuration (FIG. 5(b)).

Next, boron 10 is implanted into the entire surface of the element at an energy so that the boron cannot transit the polysilicon film 8 but can transit the $SiO_2$ film 7, and then the boron 10 is activated by annealing to produce the third p conductivity type region 6.

In the above-described processes, the boron 10 for producing the third p conductivity type region 6 is implanted after patterning the polysilicon film 8 which is to be a charge transfer electrode of the CCD, and thereby the spreading of boron having a large diffusion coefficient is suppressed. If boron spreads to such an extent that the third p conductivity type region 6 extends to the deep portion of the n conductivity type region 5, the effective impurity concentration of the n conductivity type region 5 which stores photoelectrons will be reduced and the storage capacitance is lowered.

The prior art solid-state imaging device constituted as described above has typically two problems.

First, although the third p conductivity type region 6 is produced at a later process so that it spreads as little as possible, it is not possible to avoid annealing. For example, a reflow treatment for producing a flattening film on the polysilicon film 8 is carried out at high temperature or about 900° C. Therefore, the boron ions implanted in the process step of FIG. 5(c) are further diffused during the later process, thereby reducing the effective impurity concentration of the second n conductivity type region 5 which determines the total storage charge amount of the photodiode. In addition, since the pn junction is deep relative to the surface, the sensitivity to blue light which is absorbed near the surface region is lowered.

Second, the electron potential $\phi_{PD}$ and the maximum storage charge amount $Q_{PD}$ when the second n conductivity type region 5 is depleted, shown in FIG. 7 vary as shown in FIG. 8 in response to the impurity concentration of the n conductivity type region 5. While the maximum storage charge amount $Q_{PD}$ needs to be more than a predetermined value (shown by an upward directed arrow in FIG. 8), the electron potential $\phi_{PD}$ needs to be less than a potential value determined by the voltage applied to the charge transfer electrode of the CCD (shown by a downward directed arrow in FIG. 8). The relation between the maximum storage charge amount $Q_{PD}$ and the electron potential $\phi_{PD}$ can be represented by the formula $Q_{PD} = C_{PD} \times \phi_{PD}$, using the capacitance $C_{PD}$ of the depletion layer adjacent the pn junction. Accordingly, in order to satisfy the above-described two conditions, the maximum storage charge amount $Q_{PD}$ can be increased by increasing the capacitance $C_{PD}$ of the depletion layer, that is, by narrowing the depletion layer at both sides of the second n conductivity type region 5 even keeping the same electron potential $\phi_{PD}$. However, incident light is converted to charge carriers in the depletion layer and the number of generated electrons as a function of the incident light amount depends on the width of the depletion layer. Therefore, when the depletion layer extending at both sides of the second n conductivity type region 5 is narrowed to increase the capacitance $C_{PD}$ of the depletion layer, the sensitivity of the element is reduced.

As described above, in the prior art solid-state imaging device, it is difficult to form a shallow and high-impurity concentration p conductivity type region 6 that reduces the generation of dark current at the surface of the photodiode. It is also difficult to satisfy the desired conditions for the electron potential and for the maximum storage charge amount required to maintain good sensitivity.

SUMMARY OF THE INVENTION

It is an object of the present invention to provide a solid-state imaging device that has a good blue-color sensitivity and that can increase the maximum storage charge amount in response to each potential value without loss in the sensitivity.

It is another object of the present invention to provide a production method therefor.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a photo detector of a solid-state imaging device comprises a first conductivity type semiconductor layer in which a second conductivity type semiconductor layer is formed, and a first conductivity type impurity diffusion layer formed in the surface region of the second conductivity type semiconductor layer. The second conductivity type semiconductor layer comprises at least two second conductivity type impurity diffusion layers having different impurity concentrations, and the second conductivity type impurity diffusion layer which is in contact with the first conductivity type impurity diffusion layer has an impurity concentration higher than that of the other second conductivity type impurity diffusion layers. Therefore, the junction capacitance between the second conductivity type semiconductor layer, and the first conductivity type diffusion layer at the periphery thereof and the first conductivity type semiconductor layer are increased, so that the maximum storage charge amount when the first conductivity type impurity diffusion layer is depleted is increased at the same potential. In addition, the second conductivity type semiconductor layer has a low impurity concentration and a deep pn junction, thereby preventing the deterioration of the sensitivity due to expansion of the depletion layer in the depth direction.

According to a second aspect of the present invention, a method for producing a solid-state imaging device includes selectively forming a second conductivity type impurity diffusion region in a first conductivity type semiconductor layer and forming a charge transfer electrode such that an end portion thereof coincides with that of the second conductivity type impurity diffusion region, implanting a second conductivity type impurity into the surface region of the second conductivity type impurity diffusion region using the charge transfer electrode as a mask to produce a second conductivity type high impurity concentration region that has an impurity concentration higher than that of the second conductivity type impurity diffusion region and a shallow junction, and implanting a first conductivity type impurity into the surface of the second conductivity type high impurity concentration region using the charge transfer electrode as a mask to produce a first conductivity type impurity diffusion layer that has a shallower junction than the second conductivity type high impurity concentration region. Therefore, the effective profile of the first conductivity type impurity can avoid expansion toward the lower side owing to the existence of the second conductivity type high impurity concentration region at the annealing process. Accordingly, production of the pn junction at a deep position is prevented. Further, the maximum storage charge amount is not reduced and the blue-color sensitivity is not deteriorated.

DETAILED DESCRIPTION OF THE PREFERRED EMBODIMENTS

An embodiment of the present invention will be described in detail with reference to the drawings.

Figure 1:
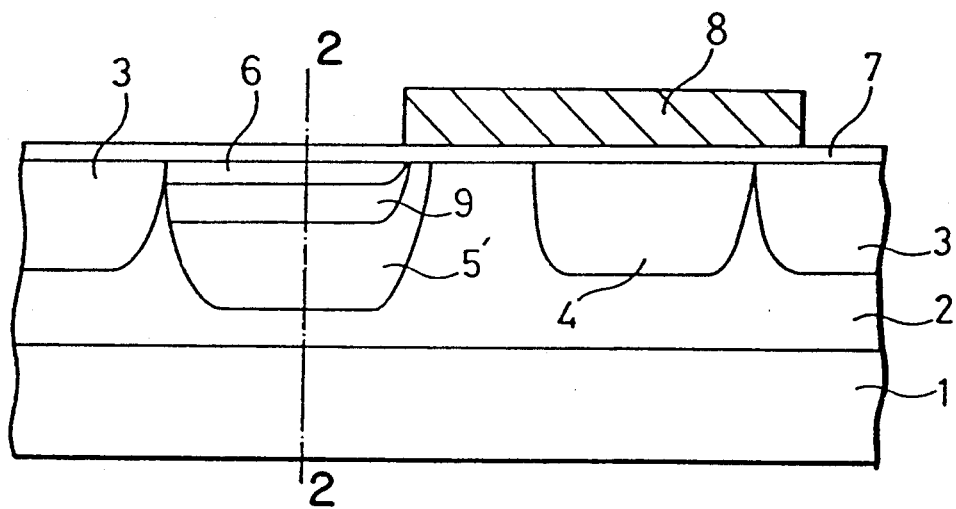
FIG. 1 is a sectional side view of a solid-state imaging device in accordance with a first embodiment of the present invention.
Figure 2:
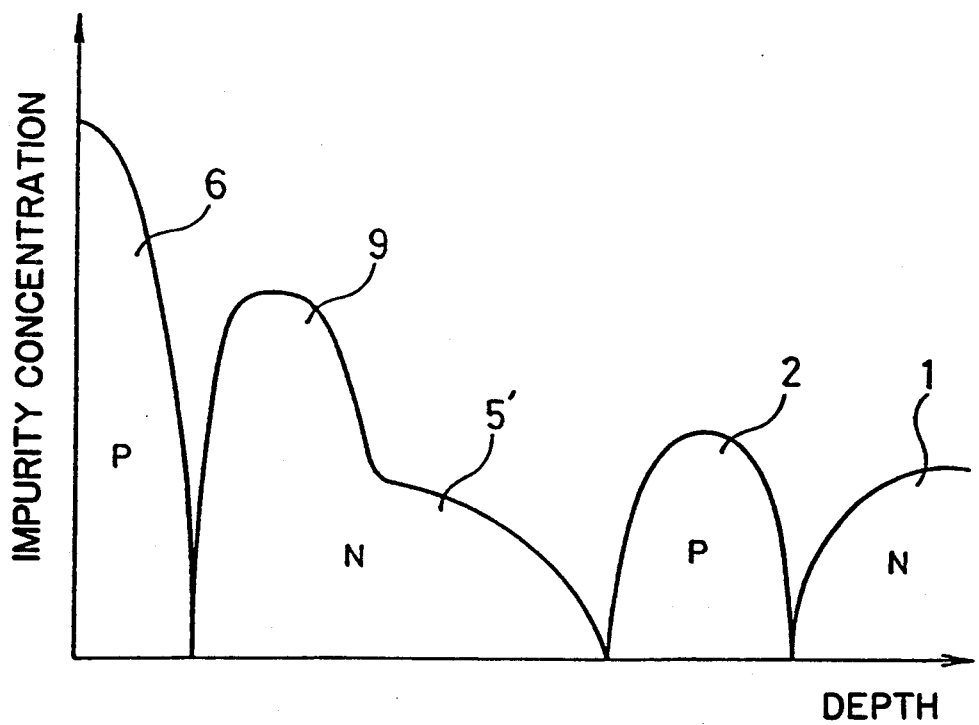
FIG. 2 is a diagram illustrating an impurity concentration distribution taken along line A—A' of FIG. 1.
Figure 3:
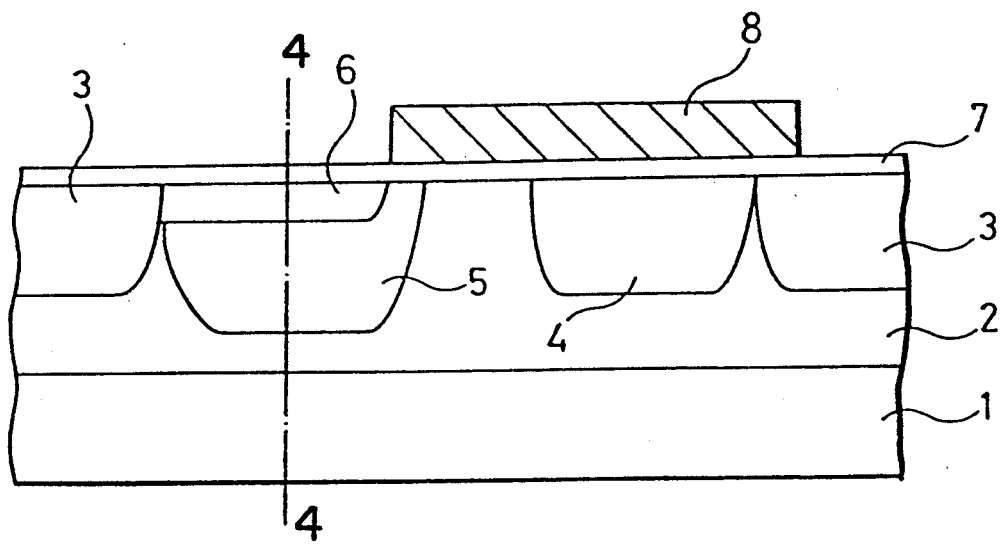
FIG. 3 is a sectional side view of a prior art solid-state imaging device.
Figure 4:
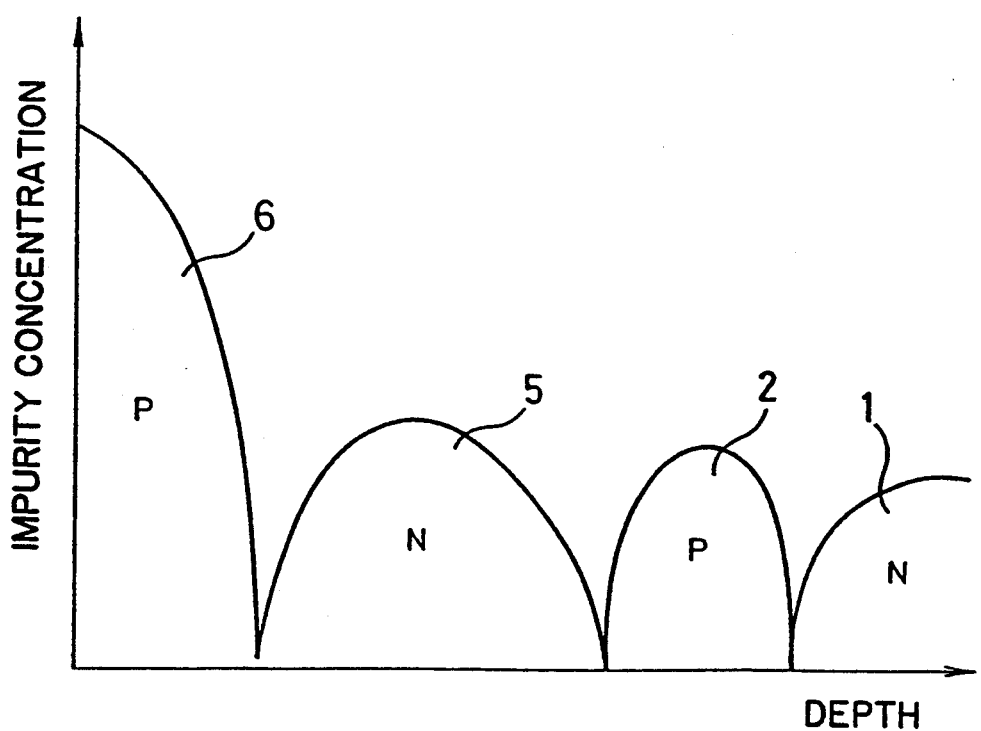
FIG. 4 is a diagram illustrating an impurity concentration distribution taken along line B—B' of FIG. 3.
Figure 9:
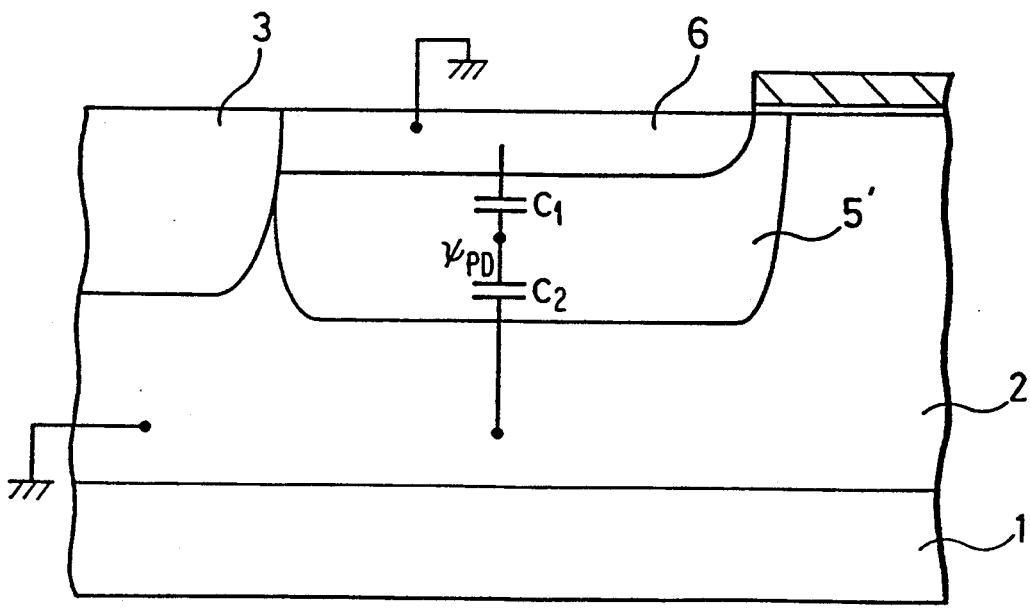
FIG. 9 is a diagram illustrating an equivalent circuit of the region around the photo detector of the solid-state imaging device.

FIG. 1 is a cross section of a solid-state imaging device in accordance with a first embodiment of the present invention. In FIG. 1, the same reference numerals as those of FIG. 3 designate the same or corresponding portions. A second n conductivity type region 5' has the same or deeper junction and a lower impurity concentration compared with the conventional one because the ion implantation amount is decreased and the impurity diffusion by annealing is increased. A third n conductivity type region 9 having a higher impurity concentration than that of the second n conductivity type region 5' (a second conductivity type high impurity concentration region) is provided between the third p conductivity type region 6 and the second n conductivity type region 5'. FIG. 2 is a diagram showing the impurity concentration distribution taken along line A—A' of FIG. 1. FIG. 9 is a diagram illustrating an equivalent circuit around the photo detector.

An operation and effects will be described.

The third n conductivity type region 9 has a higher impurity concentration than in the second n conductivity type region 5' as described above. Accordingly, in FIG. 9, the depletion layer is not expanded, resulting in a large junction capacitance $C_1$ with the third p conductivity type region 6. This is because the junction capacitance $C_1$ and the depletion layer W are related by:

$$C_1 \propto \epsilon_S/W,$$

the width of depletion layer W is represented by:

$$W = \sqrt{2 \epsilon_S \epsilon_O (N_A + N_D) \phi_{PD}} / \sqrt{q(N_A + N_D)}$$

and, the width of the depletion layer W is decreased and the junction capacitance $C_1$ is increased as the impurity concentration $N_D$ of the third n conductivity type region 9 is increased. Herein, ($\epsilon_S\epsilon_O$) represents a dielectric constant of silicon, q represents the elementary charge quantity of an impurity ion, $\phi_{PD}$ represents the potential when the second and the third n conductivity type regions 5' and 9 are depleted, and $N_A$ represents an impurity concentration of the third p conductivity type region 6.

Since the second n conductivity type region 5' is formed having a lower impurity concentration and a deeper junction than in the conventional detector shown in FIG. 2, depletion layers which are extended at both sides of the junction between the second n conductivity type region and the first p conductivity type region are wider than the conventional detector. Therefore, the photoelectric conversion capability for the incident light is increased, resulting in increased the sensitivity. That is, in the equivalent circuit of FIG. 9, while the junction region between the second n conductivity type region 5' and the first p conductivity type region 2 has a wide depletion layer and a small junction capacitance $C_2$, the junction capacitance $C_1$ is established at a large value, resulting in the total junction capacitance $C_{PD}(=C_1+C_2)$ having rather a large value. Accordingly, since the maximum storage charge amount $Q_{PD}$ of the second n conductivity type region 5' is represented by $Q_{PD}=C_{PD}\phi_{PD}$, the maximum storage charge amount $Q_{PD}$ for a predetermined potential $\phi_{PD}$ of the second n conductivity type region can be increased without reducing the sensitivity.

Next, a description will be given of a method for producing the solid-state imaging device of this embodiment with reference to FIGS. 5(a)–5(c) and 6(a)–6(b).

Figure 5A:
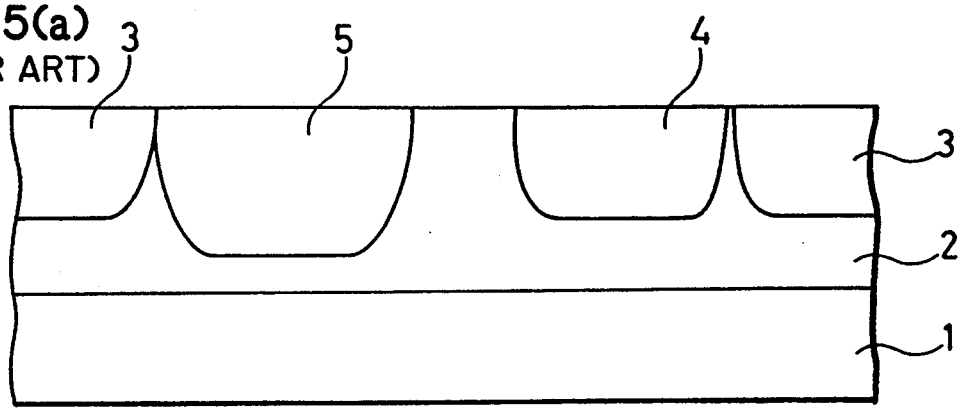
FIGS. 5(a) to 5(c) are cross-sectional views illustrating a prior art method for producing a solid-state imaging device.
Figure 5B:
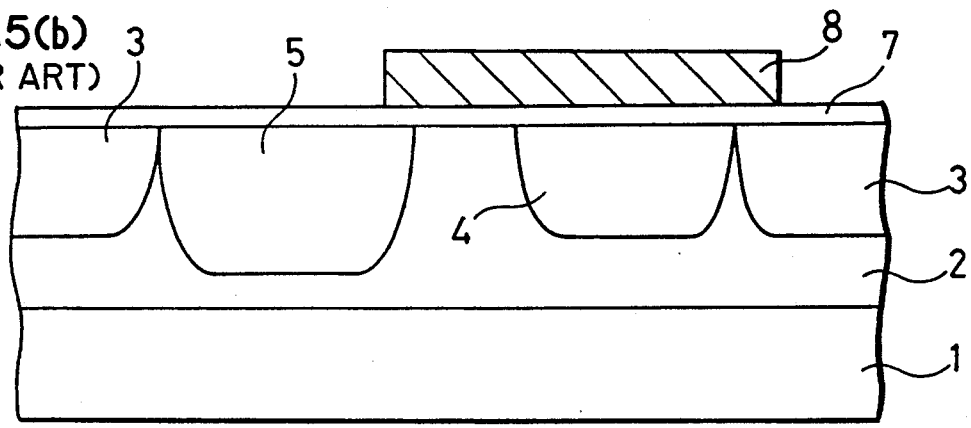
Figure 5C:
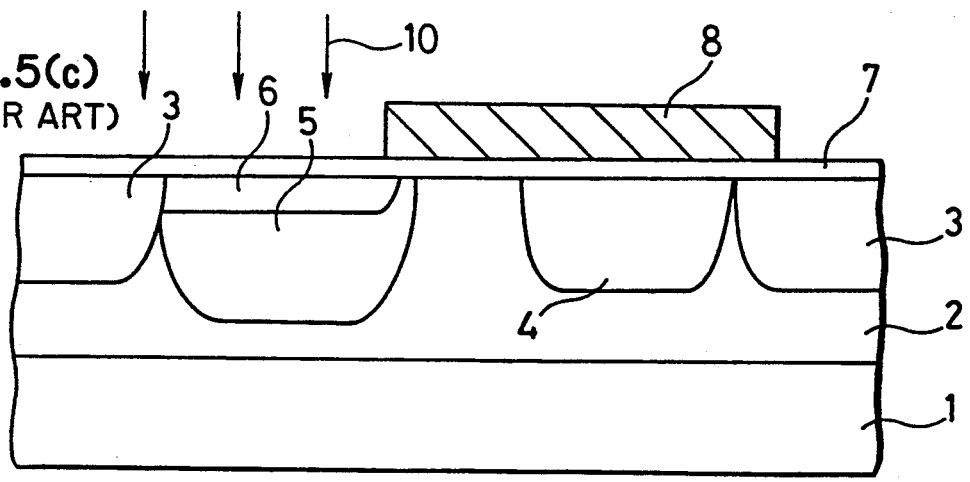

By the same steps as those of the prior art shown in FIGS. 5(a) and 5(b), the second p conductivity type region 3, the first n conductivity type region 4, and the second n conductivity type region 5' are formed in the first p conductivity type region 2 formed in the substrate 1. Then, the second n conductivity type region 5' is formed having the same or deeper junction and a lower impurity concentration compared to the prior art by reducing the ion implantation amount of n type impurity and performing the impurity diffusion by annealing.

Figure 6A:
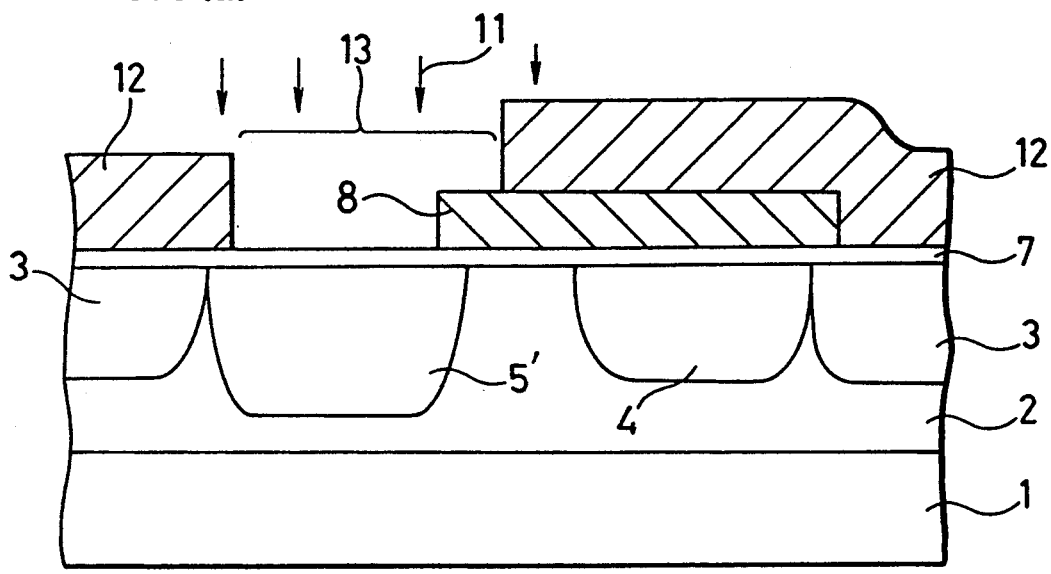
FIGS. 6(a) and 6(b) are cross-sectional views illustrating a method for producing a solid-state imaging device of FIG. 1.

Next, as shown in FIG. 6(a), a photoresist film 12 is deposited and patterned by a photolithography process and then phosphorus 11 is implanted as an n type impurity from an aperture 13 of the photoresist film 12. At this time, the aperture 13 is produced on a region including an edge portion of the polysilicon film 8 serving as a charge transfer electrode of the CCD as shown in FIG. 6(a), whereby the phosphorus implantation region is self-aligned with the polysilicon film 8.

Figure 6B:
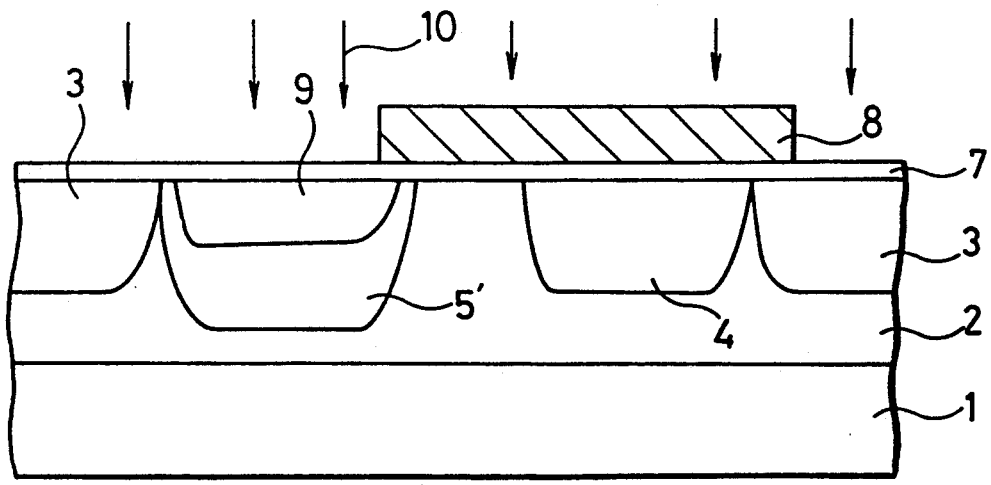
Figure 7:
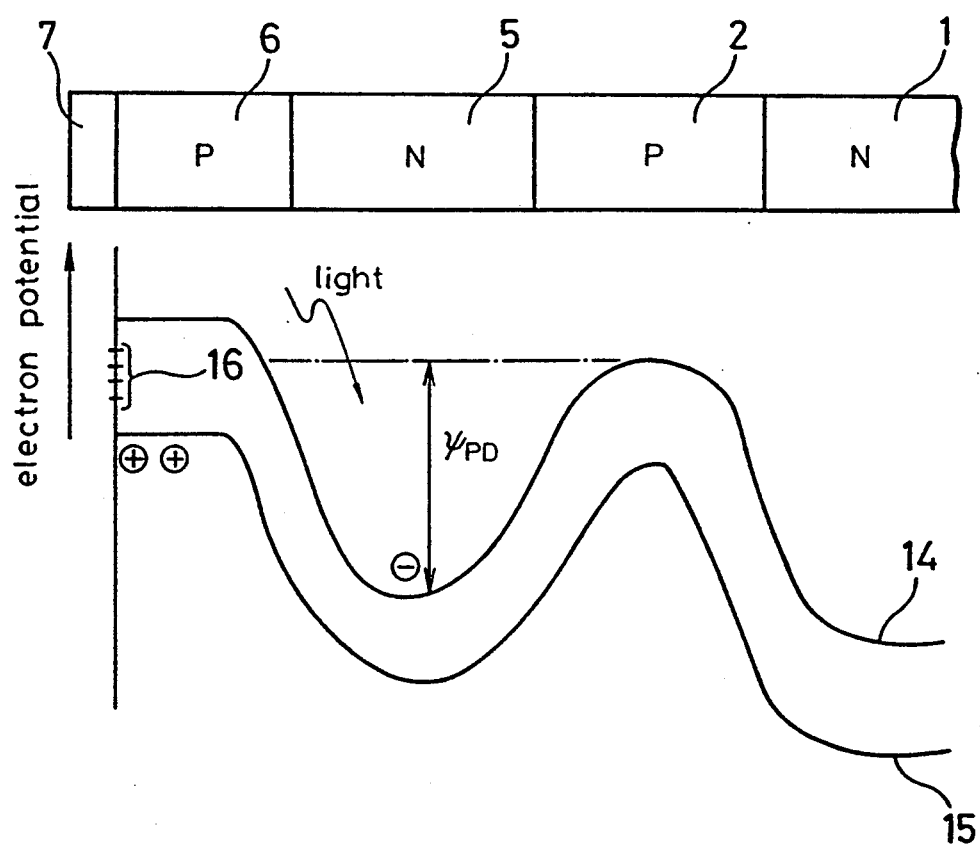
FIG. 7 is a energy band diagram of the photo detector portion in the solid-state imaging device taken along line B—B' of FIG. 3.
Figure 8:
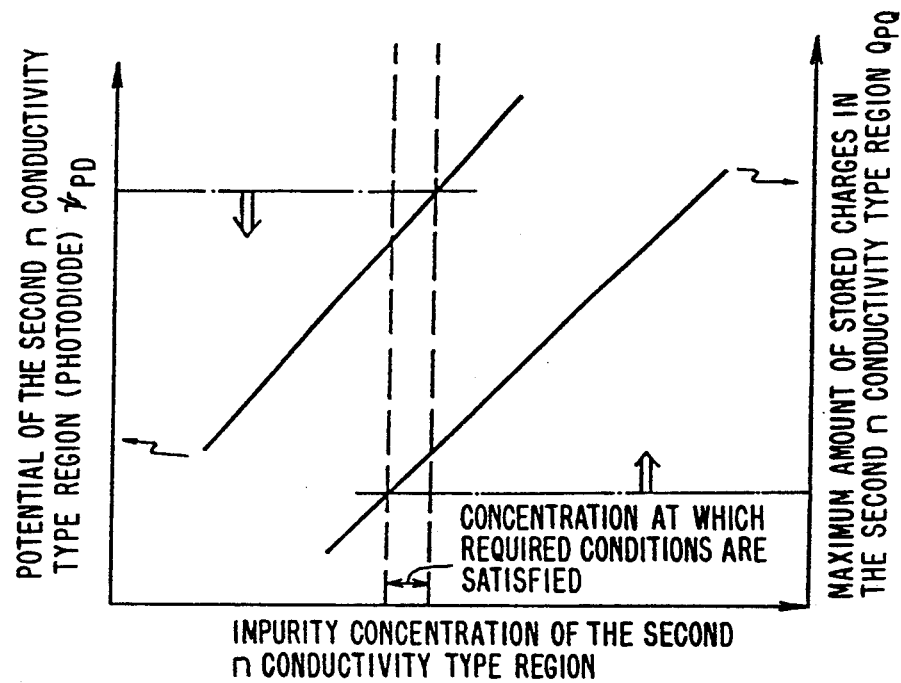
FIG. 8 is a diagram showing the dependency of the potential and on the impurity concentration in the second n conductivity type region.

Next, as shown in FIG. 6(b), boron 10 is implanted as a p type impurity into the entire surface after removing the photoresist film 12. Thereafter, the phosphorus and boron ions ion are activated by annealing to produce conductive regions having predetermined depths such that the third n conductivity type region 9 is shallower than the second n conductivity type region 5' and deeper than the third p conductivity type region 6 shown in FIG. 3. To realize such a structure, it is necessary that the implantation energy of boron in the step of FIG. 6(b) is as small as possible and that the implantation energy of phosphorus in the step of FIG. 6(a) is larger than that of boron but smaller than the energy which is required to pass through the polysilicon film 8.

The above-described structure suppresses the blooming phenomenon generated in a case where a strong light is incident. The first p conductivity type region 2 under the photo detector can be always completely depleted and can draw excessive electrons toward the n conductivity type silicon substrate 1. Therefore, the depth of the second n conductivity type region 5' and the depth and impurity concentration of the first p conductivity type region 2 is limited to a range so that electrons can be drawn toward the substrate. However, the third n conductivity type region 9 may be shallow because the depth thereof has no relation to the electron drawing operation. For example, when the depth of the first p conductivity type region 2 is 3 to 4 microns, the depth of the second n conductivity type region 5' needs to be 1 to 2 microns while the depth of the n conductivity type region 9 may be less than 0.5 micron.

In the above-described embodiment, the photo detector of the solid-state imaging device comprises the p conductivity type region comprising the first and third p conductivity type regions 2 and 6 and the n conductivity type region comprising the second and third n conductivity type regions 5' and 9 which are disposed between the two p conductivity type regions, and the impurity concentration of the third n conductivity type region 9 is made higher than that of the second n conductivity type region 5'. Therefore, the junction capacitance between the second conductivity type region and the first and third p conductivity type regions 2 and 6 at the periphery thereof is large, so that the maximum storage charge amount $Q_{PD}$ is increased when the layers are depleted by the same potential. In addition, the second conductivity type semiconductor layer has a low concentration and a deep junction, thereby expanding the depletion layer in the depth direction, resulting in no deterioration in sensitivity.

Furthermore, the second conductivity type region comprises the second n conductivity type region 5' and the third n conductivity type region 9 having a higher concentration than that of the second n conductivity type region 5'. Therefore, when the p conductivity type impurity such as boron is implanted into the third n conductivity type region and annealed, or when an annealing is carried out at the reflow process for producing a flattening film thereafter, expansion of the effective profile of the third p conductivity type region 9 toward the layer 2 is avoided owing to the existence of the second conductivity type high impurity concentration region. Therefore, it is possible to prevent the formation of pn junctions at a deep position. Further, the maximum storage charge amount is not reduced and the bluecolor sensitivity is not deteriorated.

Figure 12:
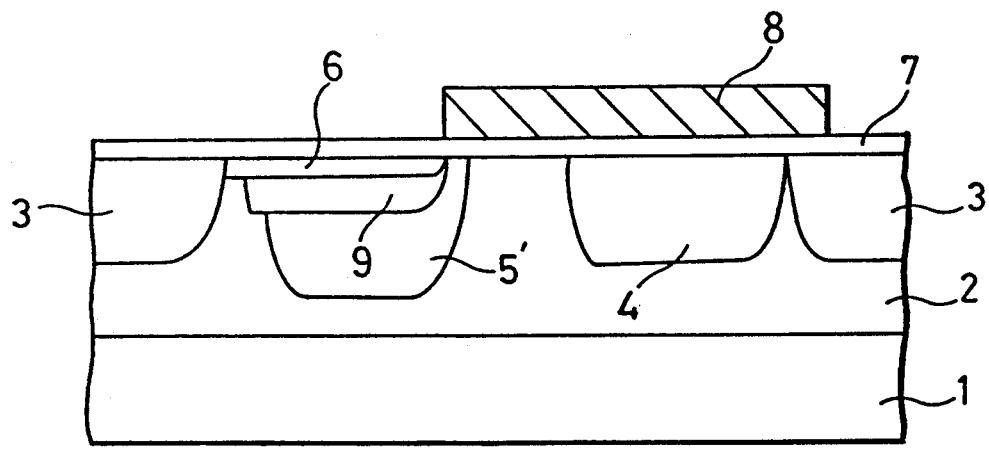
FIG. 12 is a cross-sectional view of a solid-state imaging device in accordance with second embodiment of the present invention.

In the above-described embodiment shown in FIG. 1, respective edge portions of the second and third n conductivity type regions 5' and 9 and of the third p conductivity type region 6 coincide with one another at left end. As shown in a second embodiment of FIG. 12, however, those edges may be shifted a little toward the electrode 8 successively from the upper layer to the lower layer on a condition that the third p conductivity type region 6 is in touch with the second p conductivity type region 3 which serves as a channel stopper.

While in the above-described first embodiment boron implantation is carried out after phosphorus implantation, the boron ion implantation may be carried out before phosphorus is implanted.

Furthermore, the boron ion implantation may be carried out after that phosphorus ion implantation and diffusion by annealing are carried out. In this case, there is a possibility that the second conductivity type region and the polysilicon film 8 will not be self-aligned. There also may occur difficulty in reading out the signal charges due to a depression of the potential which is generated at overlapping portions of the two regions.

While in the above described embodiment phosphorus is used as the n type impurity, arsenic may be used therefor.

In a case where the second p conductivity type region 3 serving as an element separating region has a sufficiently high do pant concentration compared with the third n conductivity type region 9, the ion implantation of phosphorus shown in FIG. 6(a) may be performed to the entire surface without using the photoresist film 12.

Figure 10A:
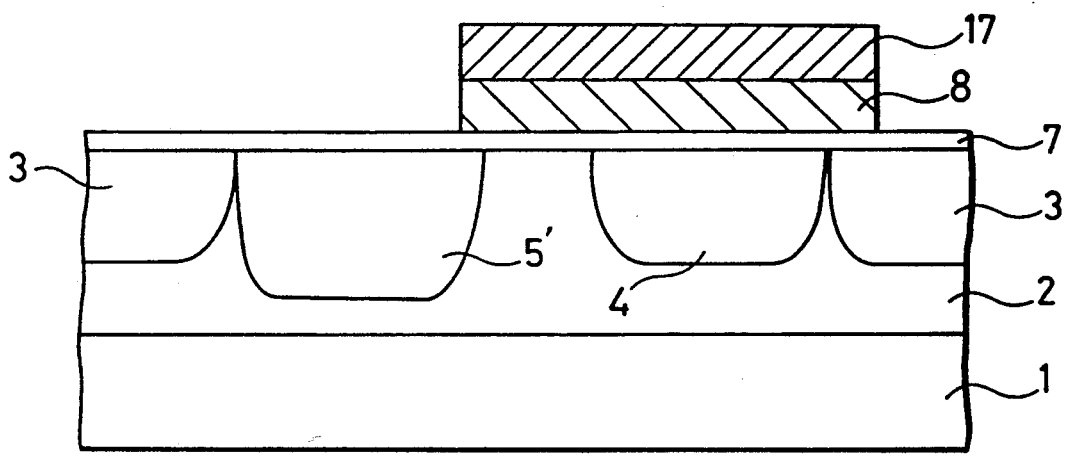
FIGS. 10(a) and 10(b) are cross-sectional views illustrating a method for producing a solid-state imaging device in accordance with a third embodiment of the present invention.
Figure 10B:
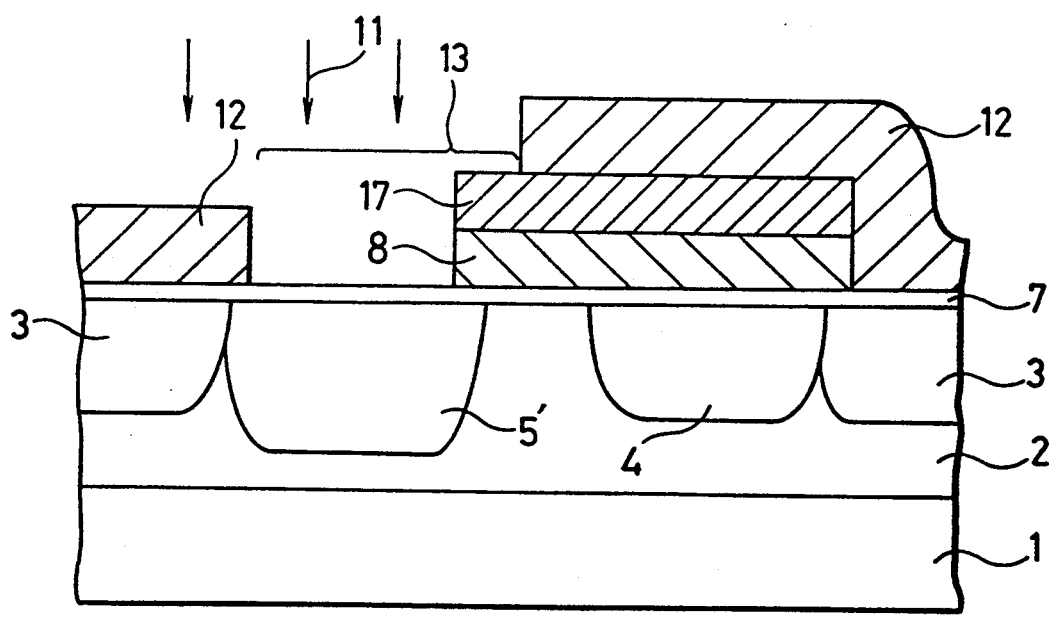

FIGS. 10(a) and 10(b) are cross sectional views showing a method for producing a solid-state imaging device in accordance with a third embodiment of the present invention. In the figures, the same reference numerals as those of FIG. 1 designate the same or corresponding portions.

A photoresist (a second photoresist film 17) used for patterning the polysilicon film 8 at the steps shown in FIG. 5(b) is not removed as shown in FIG. 10(a), and then at the step corresponding to that of FIG. 6(a), a photoresist film 12 is formed and patterned with the second photoresist film 17 remaining such that the polysilicon 8 and the photoresist film 17 deposited thereon exists within the aperture 13 as shown in FIG. 10(b). When phosphorus 11 is implanted in this state to form the n conductivity type region 9, the upper limit of the selection range of the phosphorus ion implantation energy can be made higher because the upper limit of the ion implantation energy is decided depending on the thickness of the photoresist film 17. While the upper limit of the phosphorus ion implantation energy is about 170 KeV for a polysilicon film 5000 angstroms thick in the first embodiment, it can be up to about 650 KeV employing the photoresist film 17 2 microns thick in the second embodiment. Thus, the degree of freedom in producing the third n conductivity type region 9 is largely increased.

Next, a fourth embodiment of the present invention is described.

Figure 11A:
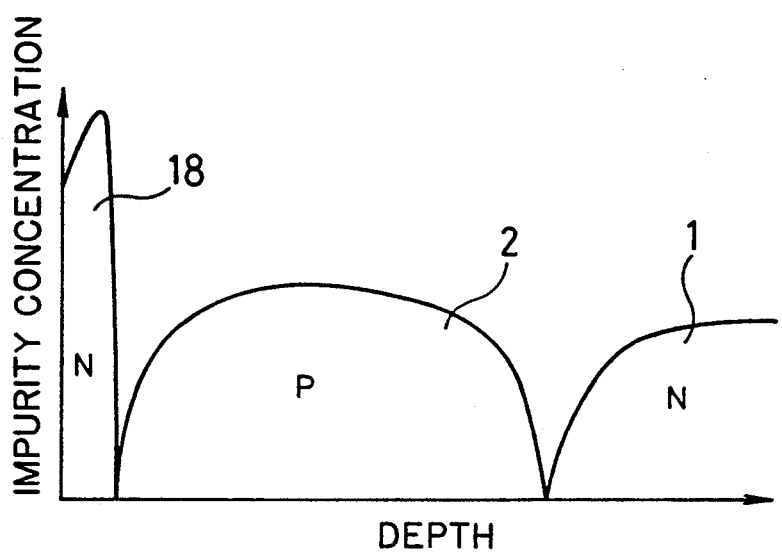
FIGS. 11(a) and 11(b) are impurity concentration distribution diagrams for explaining a method for producing a solid-state imaging device in accordance with a fourth embodiment of the present invention.
Figure 11B:
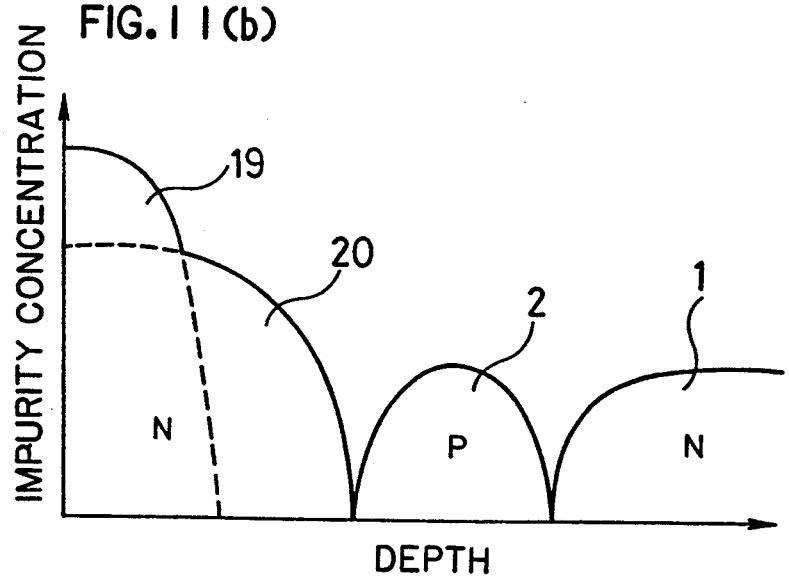

In the above-described first and third embodiments, a first ion implantation of an n conductivity type impurity is carried out followed by an annealing process, and then a second ion implantation process of the same n conductivity type impurity is carried out to produce the n conductivity type regions having two-stage impurity concentration distribution (5' and 9). However, two kinds of n type impurities having different diffusion coefficients may be used at the step of forming the second n conductivity type region 5'. That is, as shown in FIG. 11(a), phosphorus and arsenic are implanted successively without annealing, to form phosphorus-arsenic implanted layer 18. Thereafter, annealing is carried out to diffuse these impurities. Since the diffusion coefficient of phosphorus is smaller than that of arsenic by more than one order of magnitude, two stages of the concentration distribution comprising an arsenic diffusion layer 19 and a phosphorus diffusion layer 20 can be obtained as shown in FIG. 11(b).

As is evident from the foregoing description, according to the invention, a photo detector of a solid-state imaging device comprises an upper first conductivity type impurity diffusion layer, a lower first conductivity type semiconductor layer, and a second conductivity type semiconductor layer disposed therebetween. The second conductivity type semiconductor layer comprises two second conductivity type impurity diffusion layers having different impurity concentration distributions, and the two second conductivity type impurity diffusion layer which is in contact with the first conductivity type impurity diffusion layer has a higher concentration than that of the other second conductivity type impurity diffusion layer, thereby producing a solid-state imaging device having a high sensitivity and a large maximum storage charge amount.

In addition, according to the present invention, a method for producing a solid-state imaging device includes forming a second conductivity type high impurity concentration layer having an impurity concentration higher than that of a second conductivity type semiconductor layer in the second conductivity type semiconductor layer constituting a photo detector, and of implanting a first conductivity type impurity into the surface of the second conductivity type high impurity concentration region and annealing to form a first conductivity type impurity diffusion layer. Therefore, the first conductivity type impurity prevents expansion toward the second conductivity type semiconductor layer side at the annealing process. Therefore, the first conductivity type impurity diffusion layer can be shallow and having a high impurity concentration, whereby it is possible to prevent the complete depletion of the first conductivity type semiconductor layer deposited between the substrate and the second conductivity type semiconductor layer and the generation of dark current. Further, the blue light sensitivity is not reduced.

What is claimed is:

1. A method for producing a solid-state imaging device including a photodetector comprising:

selectively forming a second conductivity type region in a first conductivity type semiconductor layer;

forming a charge transfer electrode on said semiconductor layer such that an edge of said electrode lies adjacent part of the junction between said semiconductor layer and said second conductivity type region;

implanting a dopant impurity producing the second conductivity type in said second conductivity type region using said charge transfer electrode as a mask to produce a second conductivity type subregion within said second conductivity type region that has an impurity concentration higher than the remainder of said second conductivity type region; and implanting a dopant impurity producing the first conductivity type in said subregion using said charge transfer electrode as a mask to produce a first conductivity type region shallower than said second conductivity type subregion.

2. A method for producing a solid-state imaging device including a photodetector comprising:

implanting two different dopant impurity ions, each producing the second conductivity type and having different diffusion coefficients in a first conductivity type semiconductor layer;

thermally diffusing the implanted ions to produce a second conductivity type region including a relatively deep second conductivity type subregion and a relatively shallow second conductivity type region having a higher dopant impurity concentration than said relatively deep second conductivity type subregion;

forming a charge transfer electrode on said semiconductor layer such that an edge of said electrode lies adjacent part of the junction between said semiconductor layer and said second conductivity type region; and implanting a dopant impurity producing the first conductivity type in said second relatively shallow second conductivity type subregion using said charge transfer electrode as a mask to produce a first conductivity type impurity diffusion region shallower than said relatively shallow second conductivity type subregion.

3. The method for producing a solid-state imaging device of claim 1 including implanting a dopant impurity producing the second conductivity type in said layer spaced from said second conductivity type region as a channel layer for transferring charge carriers.

4. The method for producing a solid-state imaging device of claim 2 including implanting a dopant impurity producing the second conductivity type in said layer spaced from said second conductivity type region as a channel layer for transferring charge carriers.

* * * * *